(12) United States Patent
Romero (10) Patent No.: US 12,174,275 B2
(45) Date of Patent: Dec. 24, 2024

(54) MAGNETIC FIELD CLOSED LOOP SENSORS WITH OFFSET REDUCTION

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 175 days.

(21) Appl. No.: 18/176,745

(22) Filed: Mar. 1, 2023

(65) Prior Publication Data

US 2023/0204693 A1  Jun. 29, 2023

Related U.S. Application Data

(63) Continuation-in-part of application No. 17/937,556, filed on Oct. 3, 2022, now Pat. No. 11,624,791, and a continuation-in-part of application No. 17/659,515, filed on Apr. 18, 2022, now Pat. No. 11,927,650, which is a continuation-in-part of application No. 17/140,429, filed on Jan. 4, 2021, now Pat. No. 11,555,872, said application No. 17/937,556 is a
(Continued)

(51) Int. Cl.
*G01R 31/00* (2006.01)
*G01R 33/00* (2006.01)
*G01R 33/09* (2006.01)

(52) U.S. Cl.
CPC ....... *G01R 33/091* (2013.01); *G01R 33/0041* (2013.01); *G01R 33/098* (2013.01)

(58) Field of Classification Search
CPC . G01R 33/098; G01R 33/0041; G01R 33/091
See application file for complete search history.

(56) References Cited

U.S. PATENT DOCUMENTS

| 4,709,214 A | 11/1987 | Higgs |
| 5,594,173 A | 1/1997 | Frey et al. |
| 5,694,038 A | 12/1997 | Moody |

(Continued)

FOREIGN PATENT DOCUMENTS

| EP | 1 797 496 B1 | 7/2009 |
| EP | 3 954 971 A1 | 2/2022 |

OTHER PUBLICATIONS

Response to Extended European Search Report dated Oct. 28, 2022, for European Patent Application No. 22172865.2; Response filed Nov. 27, 2023; 13 pages.
(Continued)

*Primary Examiner* — Alesa Allgood
(74) *Attorney, Agent, or Firm* — Daly, Crowley, Mofford & Durkee, LLP (57) ABSTRACT

Magnetic field closed loop sensors including offset reduction circuitry to reduce undesired baseband components attributable to offset associated with magnetoresistance elements are described. A superimposed signal including a main signal portion indicative of a parameter of a target and an offset reduced signal portion is coupled to feedback circuitry. The feedback circuitry generates a feedback signal to drive a feedback coil. Main processing circuitry is operative to extract the main signal portion from the superimposed signal and produce a sensor output signal based on the main signal portion. Example offset reduction circuitry can take the form of AC coupling circuitry or a ripple reduction loop.

21 Claims, 5 Drawing Sheets

Related U.S. Application Data continuation of application No. 17/140,429, filed on Jan. 4, 2021, now Pat. No. 11,555,872.

(56) References Cited

U.S. PATENT DOCUMENTS

| | | | |
|---|---|---|---|
| 6,043,644 | A | 3/2000 | de Coulon et al. |
| 6,100,680 | A | 8/2000 | Vig |
| 6,690,155 | B2 | 2/2004 | Vig |
| 7,138,793 | B1 | 11/2006 | Bailey |
| 7,705,586 | B2 | 4/2010 | van Zon et al. |
| 7,800,389 | B2 | 9/2010 | Friedrich et al. |
| 7,923,996 | B2 | 4/2011 | Doogue et al. |
| 8,030,918 | B2 | 10/2011 | Doogue et al. |
| 8,269,491 | B2 | 9/2012 | Cummings et al. |
| 8,350,563 | B2 | 1/2013 | Haas et al. |
| 8,447,556 | B2 | 5/2013 | Friedrich et al. |
| 8,542,010 | B2 | 9/2013 | Cesaretti et al. |
| 8,680,846 | B2 | 3/2014 | Cesaretti et al. |
| 8,692,546 | B2 | 4/2014 | Cesaretti et al. |
| 8,736,369 | B2 | 5/2014 | Petrie |
| 8,818,749 | B2 | 8/2014 | Friedrich et al. |
| 9,046,562 | B2 | 6/2015 | Cummings et al. |
| 9,052,349 | B2 | 6/2015 | Haas et al. |
| 9,151,807 | B2 | 10/2015 | Friedrich et al. |
| 10,120,017 | B2 | 11/2018 | Moody et al. |
| 10,310,028 | B2 | 6/2019 | Latham et al. |
| 10,324,141 | B2 | 6/2019 | Latham et al. |
| 10,444,299 | B2 | 10/2019 | Romero et al. |
| 10,481,219 | B2 | 11/2019 | Romero et al. |
| 10,613,158 | B2 | 4/2020 | Cook et al. |
| 10,641,842 | B2 | 5/2020 | Latham et al. |
| 10,763,219 | B2 | 9/2020 | Almiron et al. |
| 10,837,943 | B2 | 11/2020 | Romero |
| 10,917,092 | B2 | 2/2021 | Romero |
| 10,996,289 | B2 | 5/2021 | Latham et al. |
| 11,047,933 | B2 | 6/2021 | Romero et al. |
| 11,125,837 | B2 | 9/2021 | Kulla |
| 11,143,732 | B2 | 10/2021 | Romero et al. |
| 11,262,422 | B2 | 3/2022 | Romero |
| 11,493,361 | B2 | 11/2022 | Romero |
| 11,555,872 | B2 | 1/2023 | Romero |
| 11,609,283 | B2 | 3/2023 | Romero |
| 11,624,791 | B2 | 4/2023 | Romero |
| 2007/0247141 | A1 | 10/2007 | Pastre et al. |
| 2009/0024889 | A1 | 1/2009 | Forrest et al. |
| 2015/0022193 | A1 | 1/2015 | Burdette et al. |
| 2015/0022198 | A1 | 1/2015 | David et al. |
| 2016/0025820 | A1 | 1/2016 | Scheller et al. |
| 2016/0139199 | A1 | 5/2016 | Petrie et al. |
| 2018/0340986 | A1 | 11/2018 | Latham et al. |
| 2018/0340989 | A1 | 11/2018 | Latham et al. |
| 2019/0025346 | A1 | 1/2019 | Latham |
| 2019/0079146 | A1 | 3/2019 | Romero et al. |
| 2020/0022529 | A1 | 1/2020 | Jalali et al. |
| 2020/0225298 | A1 | 7/2020 | Latham et al. |
| 2021/0181269 | A1 | 6/2021 | Ishida et al. |
| 2022/0076105 | A1 | 3/2022 | Foroutan et al. |
| 2022/0236347 | A1 | 7/2022 | Romero |
| 2022/0308131 | A1 | 9/2022 | Romero |
| 2023/0124351 | A1 | 4/2023 | Lutz |

OTHER PUBLICATIONS

Notice of Allowance dated Jan. 18, 2024, for U.S. Appl. No. 17/659,515; 18 pages.
U.S. Appl. No. 18/056,821, filed Nov. 18, 2022, Javvaji, et al.
U.S. Non-Final Office Action dated Apr. 23, 2020 for U.S. Appl. No. 15/901,135; 17 pages.
Response to U.S. Non-Final Office Action dated Apr. 23, 2020 for U.S. Appl. No. 15/901,135; Response filed Jul. 17, 2020; 10 pages.
U.S. Final Office Action dated Sep. 3, 2020 for U.S. Appl. No. 15/901,135; 15 pages.
Response to U.S. Final Office Action dated Sep. 3, 2020 for U.S. Appl. No. 15/901,135; Response filed Nov. 23, 2020; 13 pages.
U.S. Non-Final Office Action dated Apr. 12, 2021 for U.S. Appl. No. 15/901,135; 16 pages..
Response to U.S. Final Office Action dated Apr. 12, 2021 for U.S. Appl. No. 15/901,135; Response filed May 25, 2021; 11 pages.
U.S. Notice of Allowance dated Aug. 17, 2021 for U.S. Appl. No. 15/901,135; 9 pages.
U.S. Notice of Allowance dated Jul. 29, 2022 for U.S. Appl. No. 17/140,429; 11 Pages.
1st Amendment under Rule 312 filed on Aug. 15, 2022 for U.S. Appl. No. 17/140,429; 5 Pages.
2nd Amendment under Rule 312 filed on Oct. 3, 2022 for U.S. Appl. No. 17/140,429; 7 Pages.
Extended European Search Report dated Oct. 28, 2022 for European Application No. 22172865.2; 8 Pages.
U.S. Notice of Allowance dated Feb. 6, 2023 for U.S. Appl. No. 17/937,556; 13 Pages.

MAGNETIC FIELD CLOSED LOOP SENSORS WITH OFFSET REDUCTION

CROSS-REFERENCE TO RELATED APPLICATIONS

This application is a continuation-in-part of U.S. patent application Ser. No. 17/659,515, filed Apr. 18, 2022 and entitled "Magnetic-Field Closed-Loop Sensors with Diagnostics" which is a continuation-in-part of U.S. patent application Ser. No. 17/140,429, filed Jan. 4, 2021 and which issued on Jan. 17, 2023 as U.S. Pat. No. 11,555,872 and entitled "Reducing Stray Magnetic-Field Effects using a Magnetic-Field Closed-Loop System", the entire contents of which are incorporated herein by reference. This application is also a continuation-in-part of U.S. patent application Ser. No. 17/937,556, filed Oct. 3, 2022 and entitled "Reducing Stray Magnetic-Field Effects using a Magnetic-Field Closed-Loop System" which is a continuation of U.S. patent application Ser. No. 17/140,429, filed Jan. 4, 2021 and which issued on Jan. 17, 2023 as U.S. Pat. No. 11,555,872 and entitled "Reducing Stray Magnetic-Field Effects using a Magnetic-Field Closed-Loop System", the entire contents of which are incorporated herein by reference.

BACKGROUND

Magnetic field sensors utilize magnetic field sensing elements to detect one or more magnetic fields. Magnetic field sensors are often used to detect a ferromagnetic or conductive target and may generally act to detect motion or position of the target. Such sensors are found in many technology areas including robotics, automotive, manufacturing and so forth. For example, a magnetic field sensor may be used to detect when a vehicle wheel locks up (stops rotating), triggering the vehicle's control processor to engage an anti-lock braking system. Magnetic field sensors may also detect distance to an object. As examples, magnetic field sensors may be used to detect the position of a hydraulic piston or angular position of a steering column.

A magnetic field sensing element may be a single element or, alternatively, may include two or more magnetic field sensing elements arranged in various configurations, e.g., a half-bridge or full-bridge (Wheatstone) configuration. Depending on the device type and/or other application requirements, a magnetic field sensing element may include, e.g., a type IV semiconductor material such as Silicon (Si) or Germanium (Ge), or a type III-V semiconductor material like Gallium-Arsenide (GaAs) or an Indium compound, e.g., Indium-Antimonide (InSb).

Hall effect elements are one type of magnetic field sensing elements that generate a variable voltage in response to changes in an applied or sensed magnetic field. Magnetoresistance elements are another type of magnetic field sensing elements that have a variable resistance that changes in response to changes in an applied or sensed magnetic field. There are different types of magnetoresistance elements, for example, semiconductor magnetoresistance elements such as ones including Indium Antimonide (InSb), anisotropic magnetoresistance (AMR) elements, giant magnetoresistance (GMR) elements, and tunneling magnetoresistance (TMR) elements, which are also referred to as magnetic tunnel junction (MTJ) elements. Some magnetoresistance elements, e.g., GMR and TMR elements, may have a limited linear output range in which a change in sensed magnetic field intensity is linear with respect to a corresponding change in the resistance of the elements.

SUMMARY

An aspect of the present disclosure is directed to magnetic field sensing using magnetic closed loops with magnetic field sensing elements, e.g., magnetoresistance (MR) elements, along with features configured to reduce or eliminate offset effects associated with the MR elements. An amplifier responsive to the MR elements provides a feedback signal to a feedback coil in a closed loop to generate a magnetic feedback field. Magnetic stray field effects and any limited linearity of magnetic field sensing elements can be masked by the closed loop. According to the disclosure, offset reduction circuitry is configured to decouple offset and low frequency components (i.e., undesired baseband components) associated with the MR elements from the useful signal. Example offset reduction circuitry can take the form of AC coupling circuitry or a ripple reduction loop. The offset reduction circuitry prevents undesired DC signal components from creating high frequency ripple, which ripple would undesirably generate excessive power consumption due to current through the feedback coil and would increase the dynamic residual offset and thus, reduce the dynamic range of the system. Thus, by using the described offset reduction circuitry, the dynamic range of the system is available for processing the useful signal.

One aspect of the present disclosure is directed to a magnetic field sensor including magnetoresistance circuitry configured to receive a residual magnetic field including a difference between an applied magnetic field produced by a source at a first frequency and a feedback magnetic field and produce an electrical output signal having an undesired baseband component. Offset reduction circuitry responsive to the electrical output signal is configured to reduce the undesired baseband component and to generate a superimposed signal including a main signal portion and an offset reduced signal portion. Feedback circuitry is coupled to receive the superimposed signal and is configured to produce a feedback signal and feedback coil circuitry including a feedback coil is configured to receive the feedback signal and operative to generate the feedback magnetic field. Main processing circuitry is operative to extract the main signal portion from the superimposed signal and produce a sensor output signal based on the main signal portion, wherein the main signal portion is indicative of a physical parameter associated with the source.

Implementations may include one or more of the following features. The physical parameter associated with the source can be a position associated with the source or a speed associated with the source. The undesired baseband component can include offset associated with the magnetoresistance circuitry. The offset reduction circuitry can include AC coupling circuitry. The AC coupling circuitry can include a capacitively coupled differential pair of transistors configured to pass a high frequency signal component associated with the main signal portion and block the undesired baseband component. The offset reduction circuitry can include a ripple reduction loop. A subtraction element is configured to subtract a ripple signal generated by the ripple reduction loop from a main path signal. The feedback magnetic field includes a scaled replica of the applied magnetic field. The magnetoresistance circuitry can include a plurality of magnetoresistance elements configured as a bridge. The bridge can include one or more tunneling magnetoresistance (TMR) elements or one or more giant magnetoresistance (GMR) elements. The feedback circuitry can be coupled to receive the superimposed signal and configured to convert the main signal portion into an alternating current (AC) signal having the first frequency and to provide the AC signal to the feedback coil as a driver signal. The feedback circuitry and feedback coil circuitry can be configured as a closed loop configured to provide the feedback magnetic field. The magnetic field sensor can further include main coil circuitry configured to generate a reflected magnetic field that is reflected off of a target at the first frequency, wherein the applied magnetic field comprises the reflected magnetic field. The main coil circuitry can include a main coil and the feedback coil is configured relative to the main coil to generate a replica of the reflected magnetic field, wherein the residual magnetic field comprises the difference between the reflected magnetic field and the feedback magnetic field. The superimposed signal can be an analog signal or a digital signal.

Another aspect of the present disclosure is directed to a magnetic field sensor including magnetoresistance circuitry configured to receive a residual magnetic field including a difference between an applied magnetic field produced by a source at a first frequency and a feedback magnetic field and produce an electrical output signal having an undesired baseband component. Offset reduction circuitry including AC coupling circuitry is responsive to the electrical output signal and configured to reduce the undesired baseband component to generate a superimposed signal including a main signal portion and an offset reduced signal portion, wherein the AC coupling circuitry includes a pair of transistors coupled to form a differential pair, each transistor having a control terminal coupled to an input of the AC coupling circuitry, a first terminal coupled to a first terminal of the other transistor of the pair of transistors through a capacitor, and a second terminal coupled to an output of the AC coupling circuitry. Feedback circuitry coupled to receive the superimposed signal is configured to produce a feedback signal. Feedback coil circuitry including a feedback coil is configured to receive the feedback signal and operative to generate the feedback magnetic field. Main processing circuitry is operative to extract the main signal portion from the superimposed signal and produce a sensor output signal based on the main signal portion, wherein the sensor output signal is indicative of a physical parameter associated with the source.

Implementations may include one or more of the following features. The magnetic field sensor can include a first modulator coupled to the output of the AC coupling circuitry and configured to modulate the output of the AC coupling circuitry by the first frequency. The feedback circuitry can include a second modulator responsive to the superimposed signal and configured to convert the main signal portion into an alternating current (AC) signal having the first frequency and to provide the AC signal to the feedback coil as a driver signal. The magnetic field sensor can include main coil circuitry configured to generate a reflected magnetic field that is reflected off of a target at the first frequency, wherein the applied magnetic field comprises the reflected magnetic field. The main coil circuitry can include a main coil and the feedback coil can be configured relative to the main coil to generate a replica of the reflected magnetic field, wherein the residual magnetic field comprises the difference between the reflected magnetic field and the feedback magnetic field.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein.

DETAILED DESCRIPTION

The present disclosure is directed to closed loop magnetic field sensors that use magnetic field sensing elements, e.g., magnetoresistance (MR) elements, and include offset reduction circuitry to reduce or eliminate offset effects associated with the MR elements. Example offset reduction circuitry can take the form of AC coupling circuitry or a ripple reduction loop. The offset reduction circuitry prevents undesired DC, or baseband signal components from generating high frequency ripple, which ripple, if present would result in power consumption due to current through the feedback coil and would increase the dynamic residual offset and thus, reduce the dynamic range of the system. Thus, by using the described offset reduction circuitry, the dynamic range of the system is available for processing the useful signal.

The magnetic closed loop of described sensors achieves sensitivity/gain that is independent of the sensitivity/gain of the magnetic field sensing elements. Deleterious effects of magnetic stray fields and any limited linearity of the magnetic field sensing elements, e.g., MR element(s), can be masked by the loop gain of the closed loop.

The sensed magnetic field, referred to herein alternatively as the applied magnetic field, can be from an external magnetic field source or can be a reflected field and can be amplified and fed back to the magnetic field sensing elements, e.g., MR elements, by a feedback coil such that the magnetic field sensing elements operate in a linear range. The feedback configuration can be a negative feedback configuration, in exemplary embodiments. In other embodiments, a positive feedback configuration may be used, e.g., with a controlled gain of less than unity (1.0).

Embodiments of the present disclosure include a magnetic feedback loop that can linearize a response of magnetic field sensing elements, e.g., magnetoresistance element such as TMRs and/or GMRs or the like. The overall system/sensor sensitivity/gain does not depend on the sensitivity of the given magnetic field sensing elements and can therefore avoid negative impacts arising from any associated nonlinearities of the magnetic field sensing elements. By not depending on the sensitivity/gain of the magnetic field sensing elements, undesirable nonlinear effects can be masked. Examples of undesirable nonlinear effects can include sensitivity drifts produced by stray magnetic fields or by temperature or mechanical stresses shifting the operating point of an MR element on its transfer function curve to a non-linear region.

As used herein, the term "magnetic field sensor" is used to describe a circuit that uses one or more magnetic field sensing elements, generally in combination with other circuits. Magnetic field sensors are used in a variety of applications, including, but not limited to, angle sensors that sense an angle of a direction of a magnetic field, current sensors that sense a magnetic field generated by a current carried by a current-carrying conductor, magnetic switches that sense the proximity of a ferromagnetic object, rotation detectors that sense passing ferromagnetic articles, for example, magnetic domains of a ring magnet or a ferromagnetic target (e.g., gear teeth) where the magnetic field sensor is used in combination with a back-biased or other magnet, and magnetic field sensors that sense a magnetic field density of a magnetic field.

As used herein, the term "target" is used to describe an object or portion of an object to be sensed or detected by a magnetic field sensor or a magnetic field sensing element such as a magnetoresistance element. The target may include a conductive material that allows for eddy currents to flow within the target.

Figure 1:
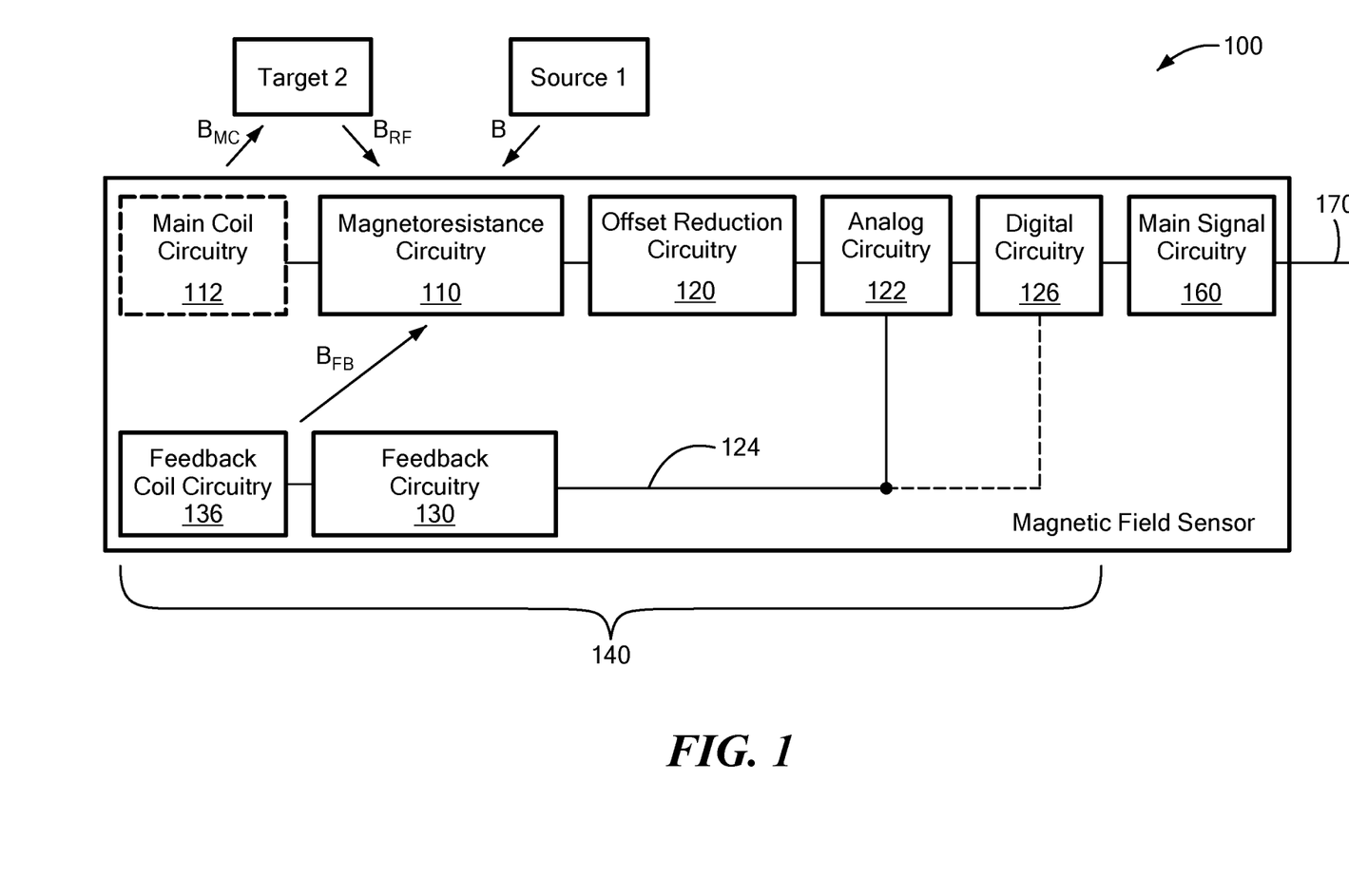
FIG. 1 is a block diagram of an example magnetic field sensor having a magnetic closed loop for detecting an applied magnetic field and including offset reduction circuitry, in accordance with the present disclosure.

FIG. 1 is a block diagram of an example of a magnetic field sensor 100 having a magnetic closed loop and including offset reduction circuitry 120, in accordance with the present disclosure. Magnetic field sensor 100 includes magnetoresistance circuitry 110 that is part of a magnetic closed loop (a.k.a., feedback loop) 140 including feedback circuitry 130 and feedback coil circuitry 136 that generates a feedback magnetic field ($B_{FB}$).

The magnetoresistance circuitry 110 is configured to sense or detect one or more magnetic fields, including a residual magnetic field (a.k.a., a resultant or error magnetic field) resulting from a combination of an external applied (B) or reflected ($B_{RF}$) magnetic field, which may be at a first frequency ($f_1$), and the feedback magnetic field ($B_{FB}$). Magnetoresistance elements 110 can have relatively poor signal to offset ratios and, in fact, can have offset levels that are much larger than the maximum signal to be sensed.

Offset reduction circuitry 120 is responsive to the magnetoresistance circuitry 110 and is configured to reduce undesired baseband components such as components attributable to the magnetoresistance circuitry 110. Example offset reduction circuitry 120 can take the form of AC coupling circuitry as shown and described in connection with FIGS. 2 and 3 or a ripple reduction loop as shown and described in connection with FIG. 4. The offset reduction circuitry 110 prevents undesired DC signal components from creating high frequency ripple, which would undesirably generate excessive power consumption due to current through the feedback coil and would increase the dynamic residual offset and thus, reduce the dynamic range of the system. Thus, stated differently, the offset reduction circuitry 120 prevents such ripple generation, thus optimizing power consumption, minimizing residual offset and maximizing output dynamic range (i.e., ensuring that the dynamic range of the system is available for processing the useful signal).

Sensor 100 can also include analog circuitry 122, e.g., one or more amplifiers, and digital circuitry 126, e.g., one or more filters, which can be used to process and/or condition the output signals of the offset reduction circuitry 120 to generate a feedback signal 124. The closed loop 140 is configured to use the feedback signal 124 to generate the feedback magnetic field ($B_{FB}$) and supply the feedback magnetic field ($B_{FB}$) to the magnetoresistance circuitry 110. The feedback loop 140 can be an analog closed loop as illustrated by the solid line feedback signal 124 from analog circuitry 122 or a digital closed loop as illustrated by the dotted line feedback signal 124 from the digital circuitry 126. It will be appreciated by those of ordinary skill in the art that, in the case of a digital feedback circuit, a DAC is provided (as may be part of the feedback circuitry 130) in order to convert the digital signal back to the analog domain in order to drive the coil.

Main signal circuitry 160 can process a main signal from the magnetoresistance circuitry 110, e.g., for measuring a position of a source 1 or target 2, in order to generate a sensor output signal 170 that can be indicative of the position and/or motion of the source 1 or target 2.

The applied magnetic field can be a magnetic field (B) generated by a magnetic field source 1 and/or a reflected magnetic field ($B_{RF}$) reflected from a target 2, e.g., a conductive target. In example embodiments, a target 2 may include, but is not limited to, a portion of a moving metal machine component such as a gear tooth, a camshaft lobe, a magnetic domain on a rotating shaft, or a magnetic domain on a rotating/moving element, etc. For embodiments sensing a reflected magnetic field ($B_{RF}$) reflected from a target 2, the sensed magnetic field can result from a main coil magnetic field ($B_{MC}$) that is generated by a main coil as part of main coil circuitry 112 that is reflected from the target 2 as the reflected magnetic field ($B_{RF}$), with the reflected magnetic field allowing measurement of a parameter associated with the target 2.

Figure 2:
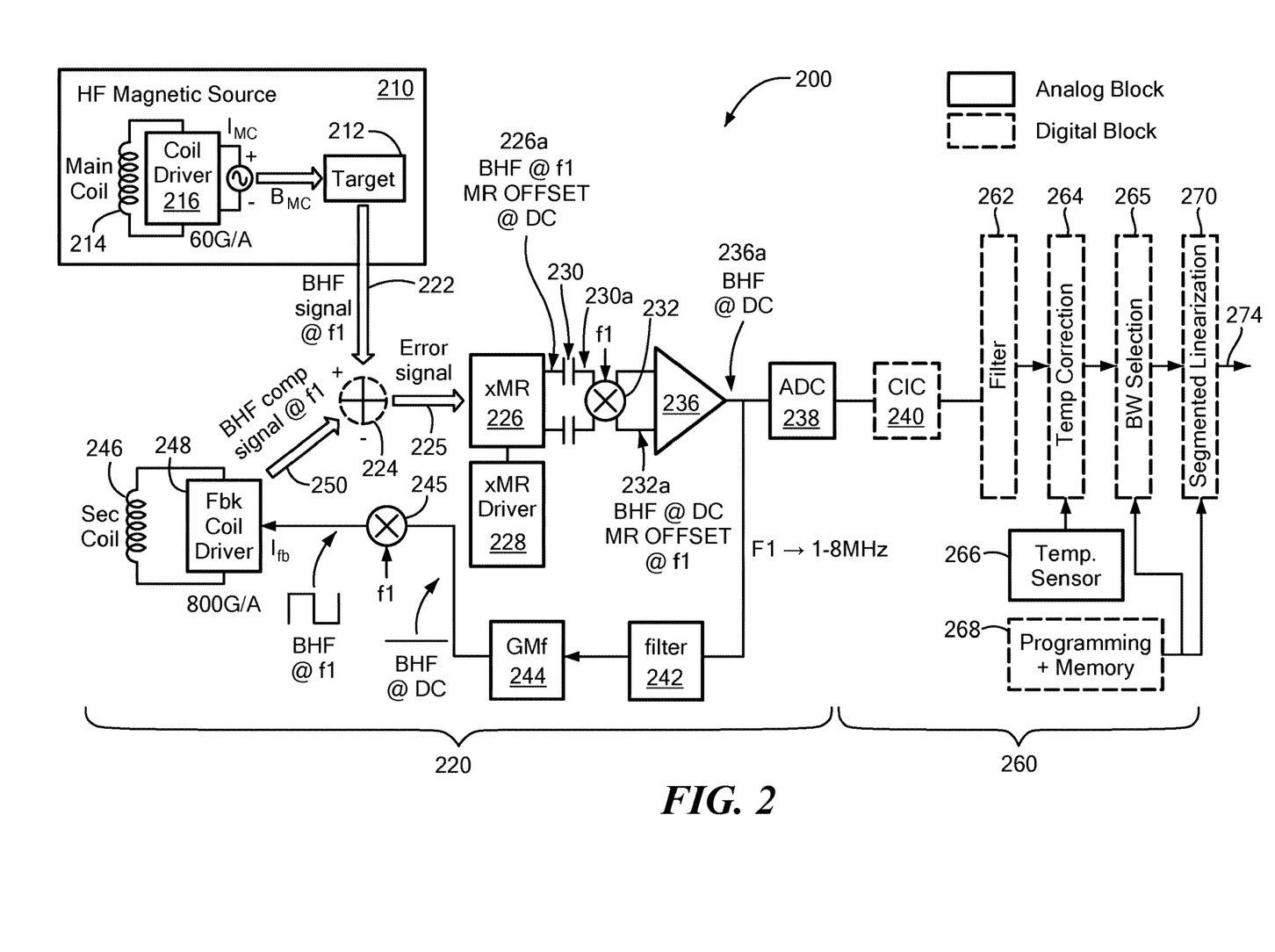
FIG. 2 shows an example magnetic field sensor having a magnetic closed loop for detecting a reflected magnetic field and including offset reduction circuitry, in accordance with the present disclosure.

FIG. 2 shows an example of a closed loop magnetic field sensor 200 for detecting an applied magnetic field (BHF) 222, in accordance with the present disclosure. The magnetic field sensor 200 includes a magnetic closed loop 220 including magnetoresistance circuitry 226, feedback circuitry 244, and a feedback coil 246 configured to generate a feedback magnetic field 250. The magnetoresistance circuitry 226 is configured to receive or detect a residual magnetic field 225 resulting from a combination of applied magnetic field 222 and feedback magnetic field 250 and produce a corresponding electrical output signal 226a, e.g., as a differential output voltage signal. Magnetoresistance circuitry 226 can be driven by a magnetoresistance driver 228. In example embodiments, the magnetoresistance circuitry 226 can include multiple magnetoresistance elements, e.g., four elements, in a bridge configuration.

Magnetic field 222 can be generated by a magnetic source 210 including a target 212 and a main coil 214 and driver 216. In this configuration, the applied field 222 can be a reflected magnetic field ($B_{RF}$) reflected from a conductive target 212. In example embodiments, target 212 may include, but is not limited to, a portion of a moving metal machine component such as a gear tooth, a camshaft lobe, a magnetic domain on a rotating shaft, or a magnetic domain on a rotating/moving element, etc. For embodiments sensing a reflected magnetic field ($B_{RF}$) reflected from a target 212, the sensed magnetic field can result from a main coil magnetic field ($B_{MC}$) that is generated by the main coil 214 driven by driver 216 and that is then directed to and reflected from the target 212 as the reflected magnetic field ($B_{RF}$), with the reflected magnetic field allowing measurement of a position of the target. In such embodiments, the applied magnetic field 222 can include a signal having a relatively high frequency f1 that is indicative of a useful signal of interest for processing by a main signal path 260 to generate an output signal 274 of the sensor 200.

In example embodiments, the feedback magnetic field 250 can be combined with the applied magnetic field 222 in a negative feedback configuration (as indicated by negative sign at 224) to form a residual magnetic field 225 that is near zero, e.g., in the linear operational range of the magnetoresistance circuitry 226. For example, by having opposite polarities, the applied magnetic field 222 and the feedback magnetic field 250 may sum to near zero. In alternate embodiments, the feedback magnetic field 250 can be combined with the applied magnetic field 222 in a positive feedback configuration with a gain of less than one, e.g., such that the residual magnetic field 225 is near zero.

Applied magnetic field 222 and feedback magnetic field 250 are indicated as being combined by sum unit 224, however an electronic sum unit 224 is not necessary for combination of the magnetic fields 222, 250 as they may be combined (e.g., be superposed) in any medium or in free space. For example, placement and/or geometry of sensing elements of magnetoresistance circuitry 226 with respect to the magnetic source 210 and feedback coil 246 can result in generation of the residual magnetic field 225 as the difference between the applied magnetic field 222 and the feedback magnetic field 250. As shown, when the fields are combined, feedback magnetic field 250 can be subtracted from applied magnetic field 222 to result in residual magnetic field 225.

The feedback magnetic field 250 generated by the feedback coil 246 can accordingly be used, in example embodiments, to reduce or attenuate the residual magnetic field such that the magnetoresistance circuitry 226 is operational in a linear region of the transfer function curve of the magnetoresistance elements. In example embodiments, the feedback magnetic field 250 can include a scaled replica of the applied magnetic field 222. Use of the feedback magnetic field 250 can accordingly allow the magnetoresistance circuitry 226 to be used in a linear range of operation and mitigate negative effects arising from undesirable signal components, for example, stray magnetic fields or by temperature or mechanical stresses that may be included in the applied magnetic field 222. The closed magnetic loop 220 can include one or more amplifiers 236 to provide a desired loop gain, without relying on the sensitivity or gain of the magnetoresistance circuitry 226.

Output signal 226a of the MR elements 226 can contain high frequency components of interest (i.e., components corresponding to the useful signal to be sensed) at the first frequency f1 and undesirable offset components at baseband as may be attributable to offset of the MR elements 226.

Offset reduction circuitry 230 configured to reduce the undesired baseband components includes series coupled capacitors, as shown. Capacitors 230 block the undesired baseband components due to offset to thereby generate a signal 230a having little or no undesired baseband components.

A modulator 232 is coupled to the capacitors 230 and is configured to shift the frequency of the received signal so that an output signal 232a of the modulator 232 includes a baseband portion indicative of a useful signal of interest (referred to herein as a main signal portion) and any undesirable offset component at frequency f1.

Amplifier 236 is coupled to receive the modulator output signal 232a and to amplify the signal in order to generate a superimposed signal 236a containing a main signal portion of interest at DC and an offset reduced signal portion (i.e., any remaining undesirable offset components) at frequency f1. The superimposed signal 236a can be provided to feedback circuitry to drive feedback coil 246 and generate the feedback magnetic field 250. For example, the superimposed signal 236a can be filtered by a filter 242 and converted from a voltage to a current by a transconductance amplifier 244. Ideally, any undesirable offset components are significantly attenuated by the capacitors 230 and so that the superimposed signal 236a at the output of amplifier 236 contains only the main signal of interest at baseband and little to no high frequency components representing offset components; however, in the event that such high frequency undesirable offset components remain in signal 236a, they can be removed by low pass filter 242 for example.

A second modulator 245 can be coupled to receive the output current signal from the transconductance amplifier 244 and generate a feedback signal Ifb for coupling to the coil driver 248. Feedback coil driver 248 can generate the drive signal for the feedback coil 246 to generate the feedback magnetic field 250 based on the feedback signal.

It will be appreciated by those of ordinary skill in the art that although the magnetic feedback loop 220 shown in the embodiment of FIG. 2 is analog (i.e., the superimposed signal is analog and conversion to the digital domain is performed by ADC 238 for digital processing by the main signal path 260), in other embodiments the closed loop 220 can include digital signals and components (e.g., as illustrated by the dotted line in FIG. 1).

The superimposed signal 236a can also be provided to main signal path 260 for extracting the main signal component and producing an output signal 274 of the magnetic field sensor 200. The signal 236a may be provided to an analog-to-digital converter 238 to convert the signal 236a from an analog signal to a digital signal. One or more filters, e.g., cascaded integrator-comb (CIC) filter 240 and/or digital filter 262, may be included for filtering, as low pass filters to remove high frequency components.

Main signal path 260 can include a temperature correction circuit 264, a temperature sensor 266, a programming and memory circuit 268, a bandwidth selection block 265, and a segmented linearization block 270, providing main signal output 274. Temperature correction block 264 may scale the output voltage signal according to temperature, e.g., a temperature measured by the temperature sensor 266. Main signal path 260 can provide main signal output 274, which in example embodiments may be indicative of an angle or position or other parameter such as speed associated with the target 212.

Figure 3:
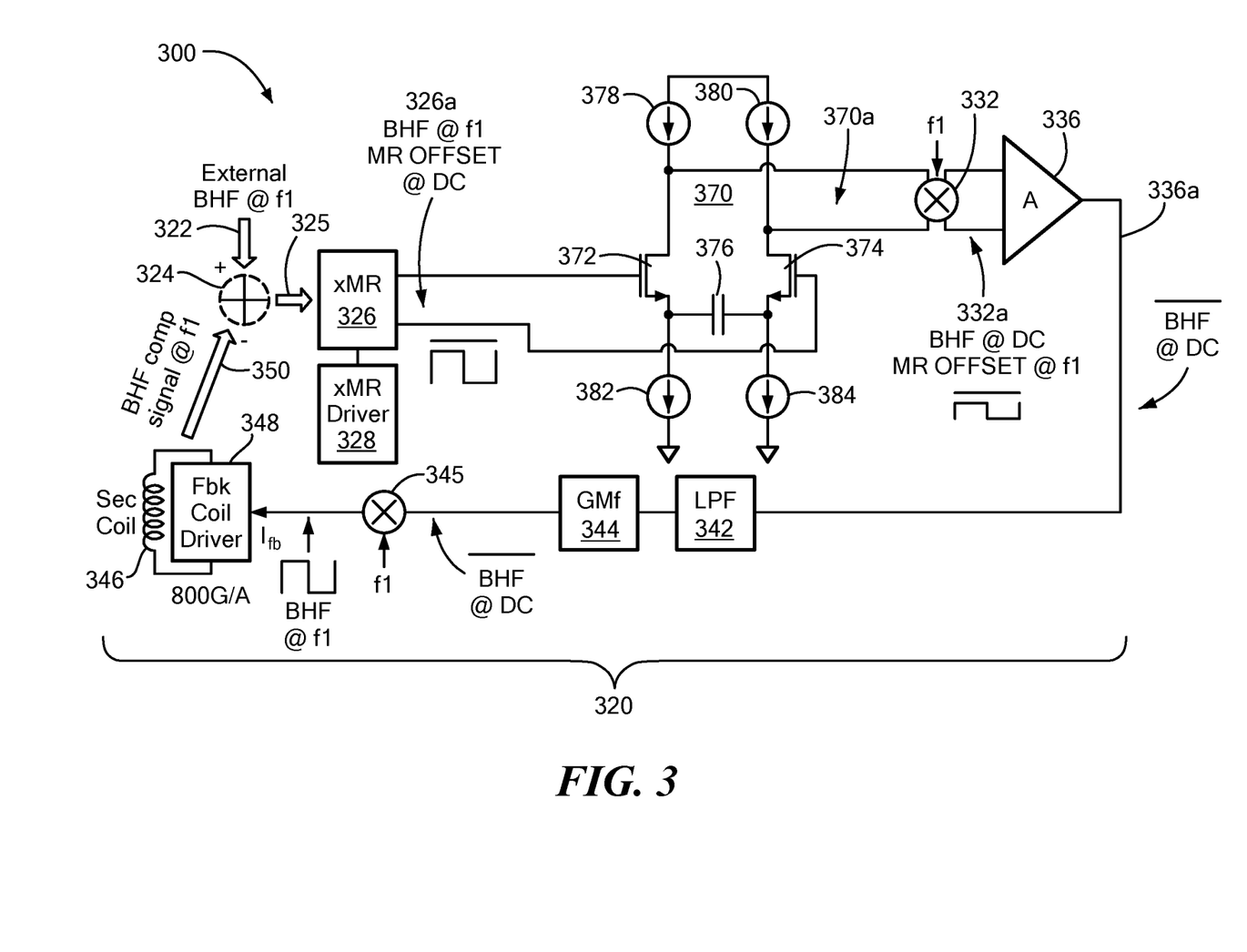
FIG. 3 shows another example magnetic field sensor having a magnetic closed loop for detecting an applied magnetic field and including offset reduction circuitry, in accordance with the present disclosure.

Referring to FIG. 3, another example magnetic field sensor 300 having a magnetic closed loop 320 for detecting an applied magnetic field and including offset reduction circuitry 370 in accordance with the present disclosure is shown. The embodiment of FIG. 3 is similar to the embodiment of FIG. 2 except that the offset reduction circuitry 370 takes a different form including a differential pair of transistors 372, 374 (i.e., rather than series coupled capacitors 230 as illustrated in FIG. 2). Further, in the sensor 300 of FIG. 3, for simplicity of illustration, the source of the applied magnetic field 322 is not shown and the main signal processing path is not shown. In general, the applied magnetic field 322 can include a signal having a relatively high frequency f1 that is indicative of a useful signal of interest for processing by a main signal path (not shown, but that can be the same as or similar to signal path 260 of FIG. 2 to generate an output signal of the sensor 300).

To this end, magnetic field sensor 300 includes magnetoresistance circuitry 326 driven by a driver 328, feedback circuitry 344, and a feedback coil 346 configured to generate a feedback magnetic field 350. The magnetoresistance circuitry 326 is configured to detect a residual magnetic field 325 resulting from a combination of applied magnetic field 322 and feedback magnetic field 350 to produce a corresponding electrical output signal 326a. The feedback magnetic field 350 generated by the feedback coil 346 can include a scaled replica of the applied magnetic field 322.

Output signal 326a of the MR elements 326 can contain high frequency components of interest (i.e., components corresponding to the useful signal to be sensed) at the first frequency f1 and undesirable offset components at baseband as may be attributable to offset of the MR elements 326.

Offset reduction circuitry 370 configured to reduce the undesired baseband components includes a differential pair of transistors 372, 374, with each transistor coupled to receive a control signal at a control, or gate terminal from the differential magnetoresistance element output signal 326a. The drain terminal of each transistor 372, 374 is coupled to a respective current source 378, 380 and the source terminal of each transistor 372, 374 is coupled to a respective current sink 382, 384, as shown. The source terminals of the transistors 372, 374 are also coupled to ends of a capacitor 376, as shown. It will be appreciated by those of ordinary skill in the art that in some embodiments, transistors 372, 374 can be bipolar transistors rather than the illustrated MOSFETs in which case, the gate terminal is a base terminal, the drain terminal is a collector, and the source terminal is an emitter. For simplicity, interchangeably, the gate or base terminal can be referred to as a control terminal, the source terminal or emitter can be referred to as a first terminal, and the drain terminal or collector can be referred to as a second terminal.

In operation, the differential pair 372, 374 functions to generate a drain current inbalance in response to the differential input signal 326a when the frequency of the input signal 326a is greater than a frequency at which the capacitor 376 acts like a short circuit or an equivalent small resistor (i.e., sometimes referred to as a degeneration resistor). Stated differently, the offset reduction circuitry 370 is configured to introduce significant gain to high frequency components of the input signal 326a (i.e., such high frequency components representing the useful signal of interest). Such gain can be on the order of 100 or 1000.

Low frequency (or DC) components of input signal 326a cause the capacitor 376 to act as an open circuit and therefore, transistors 372, 374 do not operate as a differential pair under such conditions. Rather, in response to low frequency components of input signal 326a, transistors 372, 374 function as independent source followers, decoupled from each other, in which case differential voltage variations at their control terminals will not create a drain current unbalance, thereby attenuating such DC and low frequency components. In other words, in example MOS transistors 372, 374, a differential DC voltage at the gates keeps the drain currents balanced since both gate source voltages will stay the same, provided the sources are decoupled by the capacitor at DC. Thus, the offset reduction circuitry 370 is configured to attenuate low frequency components of the input signal 326a (i.e., such low frequency components representing undesirable offset).

The capacitor 376 can be sized such that it represents the desired degeneration resistor value at the frequency f1 of the signal of interest. For example, for a frequency f1 of 1 MHz, a 100 pf capacitor 376 will act as a 1.59 Kohm resistor. And at higher values of frequency f1, the impedance of the capacitor 376 will decrease, thereby representing smaller degeneration resistors and thus, increasing loop gain.

A modulator 332 is coupled to the offset reduction circuitry 370 and is configured to shift the frequency of the received signal so that an output signal 332a of the modulator 332 includes a baseband portion indicative of a useful signal of interest (referred to herein as a main signal portion) and any remaining, or residual undesirable offset components that are not attenuated by offset reduction circuitry 370 at frequency f1.

Amplifier 336 is coupled to receive the modulator output signal 332a and to amplify the signal in order to generate a superimposed signal 336a containing a main signal portion of interest at DC and an offset reduced signal portion (i.e., any remaining undesirable offset components) at frequency f1. The superimposed signal 336a can be provided to feedback circuitry to drive feedback coil 346 and generate the feedback magnetic field 350. For example, the superimposed signal 336a can be filtered by a filter 342 to remove any remaining, or residual high frequency undesirable offset components and converted from a voltage to a current by a transconductance amplifier converter 344.

A second modulator 345 can be coupled to receive the output current signal from the transconductance amplifier 344 and generate a feedback signal Ifb for coupling to the coil driver 348. Feedback coil driver 348 can generate the drive signal for the feedback coil 346 to generate the feedback magnetic field 350 based on the feedback signal.

It will be appreciated by those of ordinary skill in the art that although the magnetic feedback loop 320 shown in the embodiment of FIG. 3 is an analog feedback loop, in other embodiments the closed loop 320 can include digital signals and components (e.g., as illustrated by the dotted line in FIG. 1).

Figure 4:
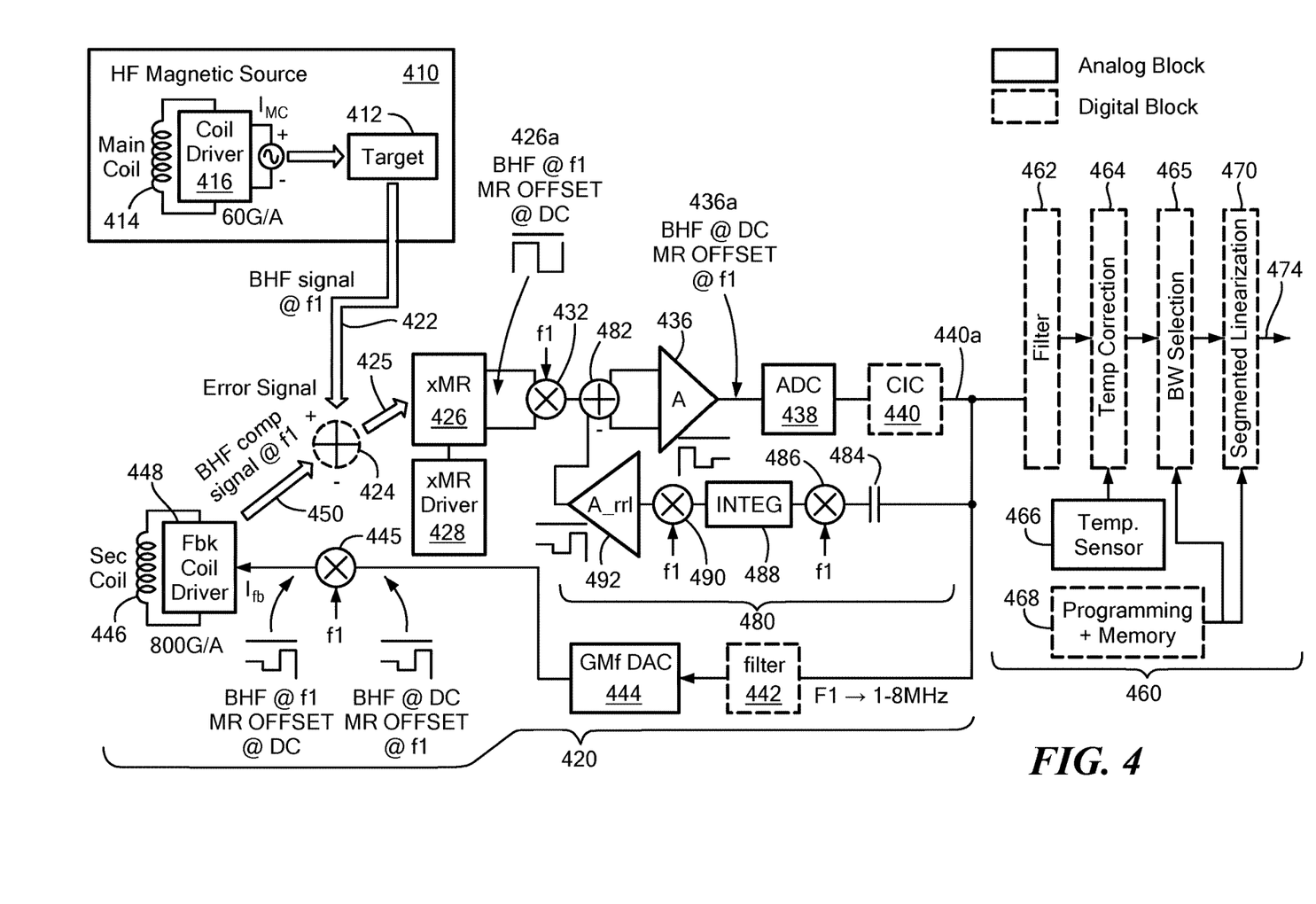
FIG. 4 shows an example magnetic field sensor having a magnetic closed loop for detecting an applied magnetic field and including offset reduction circuitry in the form of a ripple reduction loop, in accordance with the present disclosure.

Referring to FIG. 4, another example magnetic field sensor 400 having a magnetic closed loop 420 for detecting an applied magnetic field and including offset reduction circuitry 480 in accordance with the present disclosure is shown. The embodiment of FIG. 4 is similar to the embodiment of FIG. 2 except that the offset reduction circuitry takes a different form of a ripple reduction loop 480.

To this end, magnetic field sensor 400 includes magnetoresistance circuitry 426 driven by a driver 428, feedback circuitry 444, and a feedback coil 446 configured to generate a feedback magnetic field 450. The magnetoresistance circuitry 426 is configured to detect a residual magnetic field 425 resulting from a combination of applied magnetic field 422 and feedback magnetic field 450 to produce a corresponding electrical output signal 426a. The feedback magnetic field 450 generated by the feedback coil 446 can include a scaled replica of the applied magnetic field 422.

Output signal 426a of the MR elements 426 can contain high frequency components of interest (i.e., components corresponding to the useful signal to be sensed) at the first frequency f1 and undesirable offset components at baseband as may be attributable to offset of the MR elements 426.

A modulator 432 is coupled to the summing node 482 and is configured to shift the frequency of the received signal 426a so that an output signal of the modulator 432 includes a baseband portion indicative of a useful signal of interest (referred to herein as a main signal portion) and any undesirable offset component at frequency f1.

An amplifier 436 generates a superimposed signal 436a containing a main signal portion of interest at DC and an offset reduced signal portion at frequency f1. The superimposed signal 436a can be converted into a digital signal by analog-to-digital converter 438 and filtered by a filter 440, as may take the form of a cascaded integrator-comb (CIC) filter, that generates a digital superimposed signal 440a. Like superimposed signal 436a, signal 440a contains a main signal portion of interest at DC and an offset reduced signal portion at frequency f1.

Signal 440a can be coupled to offset reduction circuitry in the form of ripple reduction loop 480 that is configured to reduce the undesired offset components of signal 440a attributable to MR offset. To this end, the ripple reduction loop 480 can include a modulator 486 tuned to the frequency of the ripple component (i.e., frequency f1) in order to thereby shift the offset component to DC, an integrator 488, a demodulator 490 tuned to frequency f1 to shift the offset component back to frequency f1, and an amplifier 492 to apply gain. Capacitor 484 can be provided to block the main signal portion of interest of the signal 440a since the ripple reduction loop 480 is designed to operate on the offset generated ripple component rather than the useful signal of interest.

In general, the ripple reduction loop 480 operates to replicate the MR ripple component at the output of amplifier 492 and subtract the replicated ripple component (i.e., by operation of subtraction element 482 to which the ripple reduction loop 480 is coupled) from the offset component as seen at the input of amplifier 436. After a few clock cycles of operation of the negative feedback ripple reduction loop 480, the ripple component of signal 440a is attenuated, thereby reducing or eliminating any adverse effect of the ripple component on the dynamic range.

Although offset associated with amplifier 436 is generally significantly less than offset associated with MR elements 426, in some embodiments it may be desirable to chop the amplifier 436, for example in order to reduce any adverse effects of amplifier offset. Such amplifier chopping can be performed at a frequency different than frequency f1 (e.g., at a frequency fchop). In such an arrangement, a second ripple reduction loop can be provided tuned to the frequency fchop in order to remove the amplifier offset component. Alternatively, since the contribution of amplifier offset attributable ripple is significantly smaller than MR offset induced ripple, subsequent low pass filtering can satisfactorily remove any ripple due to the amplifier offset without requiring a second ripple reduction loop. As another alternative, amplifier 436 can be chopped at the same frequency f1, in which case the illustrated ripple reduction loop 480 tuned to frequency f1 could reduce or eliminate the lesser effects of the amplifier offset.

Signal 440a is coupled to feedback circuitry to drive feedback coil 446 and generate the feedback magnetic field 450. For example, the signal 440a can be filtered by a filter 442 to remove any remaining undesirable offset components and converted from a digital voltage to an analog current by a transconductance amplifier and digital-to-analog converter 444.

A second modulator 445 can be coupled to receive the output current signal from the transconductance amplifier and digital-to-analog converter 444 and generate a feedback signal Ifb for coupling to the coil driver 448. Feedback coil driver 448 can generate the drive signal for the feedback coil 446 to generate the feedback magnetic field 450 based on the feedback signal.

It will be appreciated by those of ordinary skill in the art that although the magnetic feedback loop 420 shown in the embodiment of FIG. 4 is partially digital and partially analog, in other embodiments the closed loop 420 can be entirely analog.

The signal 440a can also be provided to main signal path 460 for extracting the main signal component and producing an output signal 474 of the magnetic field sensor 400. The signal 440a may be provided to a digital filter 462 to remove residual high-frequency components. Main signal path 460 may include a temperature correction circuit 464, a temperature sensor 466, a programming and memory circuit 468, a bandwidth selection block 465, and a segmented linearization block 470, providing main signal output 474. Temperature correction block 464 may scale the output voltage signal according to temperature, e.g., a temperature measured by the temperature sensor 466. Main signal path 460 can provide main signal output 474, which in example embodiments may be indicative of an angle or position or other parameter such as speed associated with the target 412.

Figure 5:
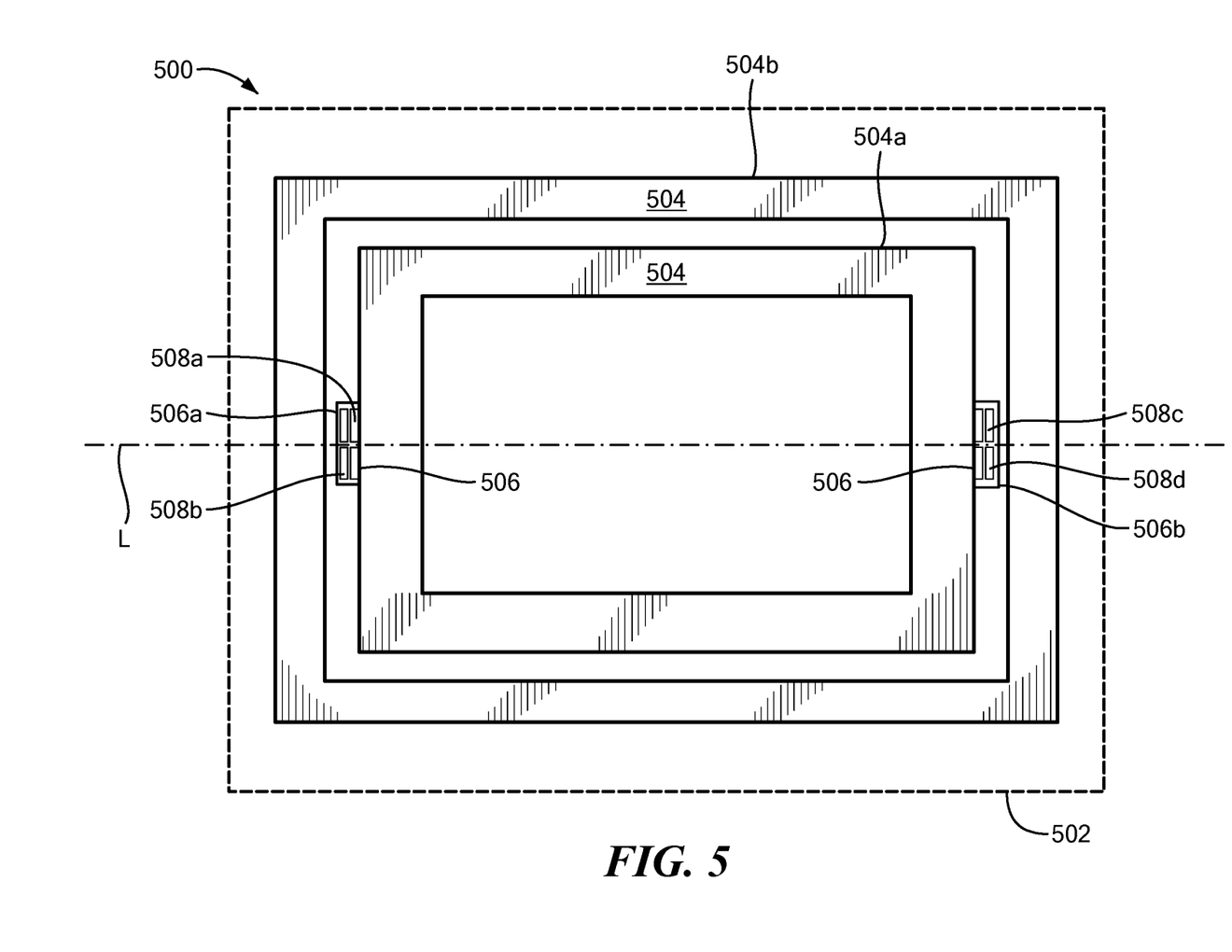
FIG. 5 is a diagram of a coil and magnetoresistance element architecture, in accordance with example embodiments of the present disclosure.

FIG. 5 is a diagram of a coil and magnetoresistance architecture 500, in accordance with example embodiments of the present disclosure. Architecture 500 includes main coil 504, a secondary or feedback coil 506, and magnetoresistance circuitry 508 including magnetoresistance elements 508a-508d in a bridge configuration, e.g., a Wheatstone bridge (bridge connections omitted for clarity). The magnetoresistance elements 508a-508d may be GMR elements and/or TMR elements, in example embodiments. A representative substrate 502, e.g., for supporting elements 504, 506, and 508, is also shown.

Main coil 504 can include inner loops 504a and outer loops 504b, as shown. For simplicity, groupings of individual loops are depicted as inner and outer loops 504a and 504b while the individual loops within the inner loops 504a and the outer loops 504b are not depicted. The magnetoresistance elements 508a-508d may be positioned between the inner loops 504a and the outer loops 504b. In example embodiments, a pair of magnetoresistance elements 508a-508b may be disposed at one end of the main coil 504, relative to a central or longitudinal axis L, and another pair of magnetoresistance elements 508c-508d may be disposed at the other end of the main coil 504.

In example embodiments, the number of inner loops 504a of main coil 504 can differ from the number of outer loops 504b by one or more loops. In other example embodiments, the number of inner loops 504a can be equal to the number of outer loops 504b. In example embodiments, the secondary coil 506, with components 506a-506b, can surround magnetoresistance elements 508a-508b and 508c-508d as shown. The secondary coil 506 can be positioned between the magnetoresistance elements 508a-508b and the main coil 504. In example embodiments, a distance between the secondary coil 506 to the magnetoresistance elements 508a-508d can be smaller than a distance between the main coil 504 to the magnetoresistance elements 508a-508d. In example embodiments, the coupling factor of the secondary coil can be, e.g., about 10 to about 20 times the main coil coupling factor, as the secondary coil 506 can be much closer to the magnetoresistance elements 508a-508d than the main coil 504 is. Accordingly, compensating for any reflected signal can be done efficiently in terms of area consumed on an integrated circuit and/or the amount of power consumed.

As noted previously, the secondary coil 506 can be used to implement magnetic feedback, e.g., as shown and described for sensor 200 of FIG. 2. The secondary coil 506 may implement or have different operational characteristics or parameters than the main coil has, e.g., in terms of area or current consumption, since the secondary coil 506 does not have to emit any field to get reflections, but simply directly couple a field to compensate for reflections. In example embodiments, the secondary coil 506 can have windings opposite in orientation or can have current applied in an opposite direction than as for main coil 504 to facilitate negative feedback, e.g., subtractive combination of a feedback magnetic field and an applied reflected magnetic field. Thus, the secondary coil can be laid out much closer to the magnetic sensing elements, e.g., TMRs, and in standard CMOS metals, potentially achieving higher coupling factors compared to the primary coil. Accordingly, embodiments of the present disclosure can be cost effective, both in terms of area and power consumption. The secondary coil 506 may use, e.g., less than 10-20× current than the main coil 504 to generate the same magnetic signal.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while reference is made above to use of magnetoresistance elements, other types of magnetic field sensing elements may be used within the scope of the present disclosure. Furthermore, implementations of the described techniques may include hardware, a method or process, or computer software on a computer-accessible medium. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:
1. A magnetic field sensor comprising:
  magnetoresistance circuitry configured to receive a residual magnetic field including a difference between an applied magnetic field produced by a source at a first frequency and a feedback magnetic field and produce an electrical output signal having an undesired baseband component;

offset reduction circuitry responsive to the electrical output signal and configured to reduce the undesired baseband component and to generate a superimposed signal comprising a main signal portion and an offset reduced signal portion;

feedback circuitry coupled to receive the superimposed signal, wherein the feedback circuitry is configured to produce a feedback signal;

feedback coil circuitry including a feedback coil configured to receive the feedback signal and operative to generate the feedback magnetic field; and main processing circuitry operative to extract the main signal portion from the superimposed signal and produce a sensor output signal based on the main signal portion, wherein the main signal portion is indicative of a physical parameter associated with the source.

2. The magnetic field sensor of claim 1, wherein the physical parameter associated with the source comprises a position associated with the source or a speed associated with the source.

3. The magnetic field sensor of claim 1, wherein the undesired baseband component comprises offset associated with the magnetoresistance circuitry.

4. The magnetic field sensor of claim 1, wherein the offset reduction circuitry comprises AC coupling circuitry.

5. The magnetic field sensor of claim 4, wherein the AC coupling circuitry comprises a capacitively coupled differential pair of transistors configured to pass a high frequency signal component associated with the main signal portion and block the undesired baseband component.

6. The magnetic field sensor of claim 1, wherein the offset reduction circuitry comprises a ripple reduction loop.

7. The magnetic field sensor of claim 6, further comprising a subtraction element configured to subtract a ripple signal generated by the ripple reduction loop from a main path signal.

8. The magnetic field sensor of claim 1, wherein the feedback magnetic field includes a scaled replica of the applied magnetic field.

9. The magnetic field sensor of claim 1, wherein the magnetoresistance circuitry comprises a plurality of magnetoresistance elements configured as a bridge.

10. The magnetic field sensor of claim 9, wherein the bridge comprises one or more tunneling magnetoresistance (TMR) elements or one or more giant magnetoresistance (GMR) elements.

11. The magnetic field sensor of claim 1, wherein the feedback circuitry is coupled to receive the superimposed signal and configured to convert the main signal portion into an alternating current (AC) signal having the first frequency and to provide the AC signal to the feedback coil as a driver signal.

12. The magnetic field sensor of claim 1, wherein the feedback circuitry and feedback coil circuitry are configured as a closed loop to provide the feedback magnetic field.

13. The magnetic field sensor of claim 1, further comprising main coil circuitry configured to generate a reflected magnetic field that is reflected off of a target at the first frequency, wherein the applied magnetic field comprises the reflected magnetic field.

14. The magnetic field sensor of claim 13, wherein main coil circuitry includes a main coil and the feedback coil is configured relative to the main coil to generate a replica of the reflected magnetic field, wherein the residual magnetic field comprises the difference between the reflected magnetic field and the feedback magnetic field.

15. The magnetic field sensor of claim 1, wherein the superimposed signal is an analog signal.

16. The magnetic field sensor of claim 1, wherein the superimposed signal is a digital signal.

17. A magnetic field sensor comprising:

magnetoresistance circuitry configured to receive a residual magnetic field including a difference between an applied magnetic field produced by a source at a first frequency and a feedback magnetic field and produce an electrical output signal having an undesired baseband component;

offset reduction circuitry comprising AC coupling circuitry responsive to the electrical output signal and configured to reduce the undesired baseband components to generate a superimposed signal comprising a main signal portion and an offset reduced signal portion, wherein the AC coupling circuitry comprises a pair of transistors coupled to form a differential pair, each transistor comprising a control terminal coupled to an input of the AC coupling circuity, a first terminal coupled to a first terminal of the other transistor of the pair of transistors through a capacitor, and a second terminal coupled to an output of the AC coupling circuitry;

feedback circuitry coupled to receive the superimposed signal, wherein the feedback circuitry is configured to produce a feedback signal;

feedback coil circuitry including a feedback coil configured to receive the feedback signal and operative to generate the feedback magnetic field; and main processing circuitry operative to extract the main signal portion from the superimposed signal and produce a sensor output signal based on the main signal portion, wherein the sensor output signal is indicative of a physical parameter associated with the source.

18. The magnetic field sensor of claim 17, further comprising a first modulator coupled to the output of the AC coupling circuitry and configured to modulate the output of the AC coupling circuitry by the first frequency.

19. The magnetic field sensor of claim 18, wherein the feedback circuitry comprises a second modulator responsive to the superimposed signal and configured to convert the main signal portion into an alternating current (AC) signal having the first frequency and to provide the AC signal to the feedback coil as a driver signal.

20. The magnetic field sensor of claim 17, further comprising main coil circuitry configured to generate a reflected magnetic field that is reflected off of a target at the first frequency, wherein the applied magnetic field comprises the reflected magnetic field.

21. The magnetic field sensor of claim 20, wherein main coil circuitry includes a main coil and the feedback coil is configured relative to the main coil to generate a replica of the reflected magnetic field, wherein the residual magnetic field comprises the difference between the reflected magnetic field and the feedback magnetic field.

* * * * *

UNITED STATES PATENT AND TRADEMARK OFFICE
CERTIFICATE OF CORRECTION

PATENT NO. : 12,174,275 B2
APPLICATION NO. : 18/176745
DATED : December 24, 2024
INVENTOR(S) : Hernán D. Romero Page 1 of 1

It is certified that error appears in the above-identified patent and that said Letters Patent is hereby corrected as shown below:

In the Specification

Column 8, Line 17, delete "Ifb" and replace with --$I_{fb}$--.

Column 10, Line 25, delete "Ifb" and replace with --$I_{fb}$--.

Column 11, Line 59, delete "Ifb" and replace with --$I_{fb}$--.

Signed and Sealed this
Twenty-fourth Day of June, 2025

Coke Morgan Stewart
*Acting Director of the United States Patent and Trademark Office*